United States Patent [19]

Miyoshi

[11] Patent Number: 5,685,476

[45] Date of Patent: Nov. 11, 1997

[54] WIRE GUIDING APPARATUS, WIRE GUIDING METHOD AND A WIRE BONDER EQUIPPED WITH SAID APPARATUS

[75] Inventor: Hideaki Miyoshi, Tokyo, Japan

[73] Assignee: Kaijo Corporation, Tokyo, Japan

[21] Appl. No.: 583,429

[22] Filed: Jan. 5, 1996

[30] Foreign Application Priority Data

Aug. 3, 1995 [JP] Japan .................................. 7-218081

[51] Int. Cl.$^6$ .................................................. H01L 21/60
[52] U.S. Cl. ........................... 228/180.5; 228/4.5; 228/8
[58] Field of Search ................................. 228/102, 103, 228/110.1, 180.5, 1.1, 4.5, 8

[56] References Cited

U.S. PATENT DOCUMENTS

| | | | |
|---|---|---|---|
| 3,894,671 | 7/1975 | Kulicke, Jr. et al. | 228/4.5 |
| 4,069,961 | 1/1978 | Nicklaus et al. | 228/4.5 |
| 4,109,846 | 8/1978 | Pennings et al. | 228/4.5 |
| 4,597,522 | 7/1986 | Kobayashi | 228/4.5 |
| 4,763,826 | 8/1988 | Kulicke, Jr. et al. | 228/4.5 |
| 4,928,871 | 5/1990 | Farassat | 228/4.5 |

Primary Examiner—Samuel M. Heinrich
Attorney, Agent, or Firm—Sughrue, Mion, Zinn, Macpeak & Seas, PLLC

[57] ABSTRACT

The present invention discloses a wire guiding apparatus and wire guiding method that automatically guide a wire supplied from a wire feeding device through the insertion holes of at least a wire clamp and bonding tool using a guiding jig.

15 Claims, 5 Drawing Sheets

WIRE GUIDING APPARATUS, WIRE GUIDING METHOD AND A WIRE BONDER EQUIPPED WITH SAID APPARATUS

BACKGROUND OF THE INVENTION

1. Field of the Invention

The present invention relates to a wire guiding apparatus and wire guiding method that contributes to increased speed of bonding work by smoothly feeding the wire to the bonding tool at times such as when the wire breaks in the wire bonder.

In addition, the present invention relates to a wire bonder equipped with the above-mentioned wire guiding apparatus.

2. Description of the Prior Art

In the assembly process of a semiconductor device, a wire bonder connects a first bonding point in the form of, for example, a pad on an IC chip, and a second bonding point in the form of, for example, an external lead formed on a lead frame on which said IC chip is affixed, using a wire having electrical continuity.

The following provides an explanation of this bonding process with reference to FIG. 1.

First, when wire bonding is performed to a pad (electrode: not shown) on IC chip 1, a bonding tool in the form of capillary 4, into which wire 3 is inserted having ball 3a formed on its end, is positioned directly above the pad by the operation of an XY table (not shown) based on data from a photographic apparatus not shown. Next, the capillary 4 is lowered as shown in steps (1) through (3) to crush ball 3a on the above-mentioned pad to perform thermocompression bonding. At this time, an ultrasonic vibration device not shown vibrates capillary 4.

Furthermore, during steps (1) to (2) of this process, the bonding arm (not shown) to which the above-mentioned capillary 4 is attached is lowered at high speed, while during steps (2) to (3), it is moved at low speed. In the drawing, reference numeral 5 indicates a wire clamp that holds wire 3. At this time, the wire clamp 5 is open. Next, when connection to this first bonding point is completed, in steps (3) to (4), the above-mentioned bonding arm moves in the upward direction indicated in FIG. 1, namely the direction of the Z axis, while wire clamp 5 remains open. Wire 3 is then pulled out with wife clamp 5 open as shown in step (5) according to a prescribed loop control, after which the wire 3 is connected to a second bonding point in the form of lead 7 shown in step (6).

After this connection, wire clamp 5 closes when wire 3 on the end of capillary 4 is pulled out by a prescribed feed amount f as shown in step (7). In this state, during a process in which the bonding arm further rises to a prescribed height, wire 3 is cut in step (8). A ball is again formed on the end of said wire 3 using an electric torch (not shown) and wire clamp 5 is opened to return to the state shown in step (1). Wire bonding is thus performed by this series of steps.

After this point, the above-mentioned series of operations are repeated for a plurality of pads provided on IC chip 1 and each lead arranged corresponding to them.

In the above-mentioned wire bonder, there are cases when wire 3 may brake and come out of capillary 4 and wire clamp 5 for some reason during bonding work. The wipe that has come out is suitably reinserted into capillary 4 after passing through wire clamp 5 by a worker so that bonding work can be continued.

In addition, although wire 3 is wound onto a spool not shown, similar wire insertion work is performed when all of the wire on the spool has been used up and the spool is replaced with a new one.

In the bonder of the prior art, however, since wire 3 is extremely fine making it difficult to handle, and a certain degree of slippage occurs even in the normal state when tension is not applied, the work of inserting wire 3 through wire clamp 5 and capillary 4 is not always easy. This problem must be solved in order to improve the efficiency of bonding work.

SUMMARY OF THE INVENTION

Therefore, in consideration of the above-mentioned disadvantages of the prior art, the primary object of the present invention is to provide a wire guiding apparatus and wire guiding method that contribute to simplification and increased speed of wire insertion work along with a wire bonder equipped with the apparatus, while another object is to provide a wire guiding apparatus that is also able to demonstrate other advantageous effects.

In order to achieve the above-mentioned primary object of the present invention, the wire guiding apparatus is composed to perform wire insertion by guiding a wire supplied from a wire feeding device through the insertion holes of at least a wire clamp and a bonding tool.

In addition, in order to achieve the above-mentioned primary object of the present invention, the wire guiding method is employed to perform wire insertion by guiding a wire supplied from a wire feeding device through the insertion holes of at least a wire clamp and a bonding tool.

Similarly, the wire bonder performs bonding using a wire inserted in a bonding tool, and is equipped with a wire guiding apparatus that performs wire insertion by guiding a wire supplied from a wire feeding device through the insertion holes of at least a wire clamp and a bonding tool.

According to the above-mentioned wire guiding apparatus, wire guiding method and wire bonder, a wire is smoothly passed through a wire clamp and inserted in the insertion hole of a bonding tool.

In addition, in the present invention, apparatuses having the various constitutions described below are employed with respect to the wire guiding apparatus in addition to that described above, enabling each of the prescribed problems to be solved.

First, the wire guiding apparatus can have a gas spraying device that sprays a gas so as to force the above-mentioned wire in the direction of guiding. According to this constitution, negative pressure is produced by the spraying of gas, the wire is pulled into the guide path by this negative pressure, and the wire that has been pulled in is forcibly fed by the spraying force of the gas.

In addition, the wire guiding apparatus can be equipped with a suctioning device that is arranged in the direction of wire guiding on the above-mentioned wire bonding tool, and suctions the above-mentioned wire together with air. In this constitution, suction force acts on the wire through the insertion hole of the bonding tool, the wire is suctioned into said insertion hole, and made to protrude from the end of the bonding tool.

Moreover, the wire guiding apparatus can have a detection device that is arranged in the wire guiding direction on the above-mentioned bonding tool, and which detects insertion of the above-mentioned wire into the above-mentioned bonding tool as well as the prescribed feeding amount. According to this constitution, the wire reaching the inside of the bonding tool and the protruding state of the wire from the end of the bonding tool are detected.

In addition, the wire guiding apparatus can have a guiding member that guides the above-mentioned wire, and a movement device that holds the guiding member and moves it between a position at which the wire is able to be guided and another position separated from said position. In this constitution, the guiding member is automatically moved by the movement device between a position at which it is to guide the wire and a withdrawn position.

Moreover, the wire guiding apparatus can include a plurality of the above-mentioned guiding members, and can be equipped with a frame that supports each of the guiding members. Namely, each of the guiding members that respectively perform wire guiding are alternately coupled in integrated fashion by the frame, and each of the guiding members is moved simultaneously with the frame by the above-mentioned movement device.

In addition, a tapered surface is formed on the above-mentioned guiding member that promotes introduction of the wire into its guide path. Accordingly, the wire is introduced smoothly by the tapered surface.

Moreover, in the present invention, a wire bonder can have the following constitution.

Namely, the wire bonder can have an ultrasonic vibration device that vibrates the above-mentioned bonding tool. In the case of inserting the above-mentioned wire into the bonding tool, the ultrasonic vibration device is operated. As a result, contract resistance during insertion of the wire into the bonding tool is reduced, thereby enabling the wire to be inserted smoothly.

The present invention is carried out for reinserting a wire in the various working devices when the wire has come out of each of the working devices used to perform prescribed work with respect to the wire, using a bonding tool and wire clamp installed on a bonding arm, as well as a wire bonder equipped with, for example, a half clamp and air tension mechanism and so forth.

Namely, the wire guiding apparatus or wire guiding method as claimed in the present invention is used when the operation of a wire bonder has stopped, and completes insertion of the wire by automatically following a wire along prescribed path in which the wire passes through each of the above-mentioned working devices.

DESCRIPTION OF THE PREFERRED EMBODIMENTS

Figure 1:
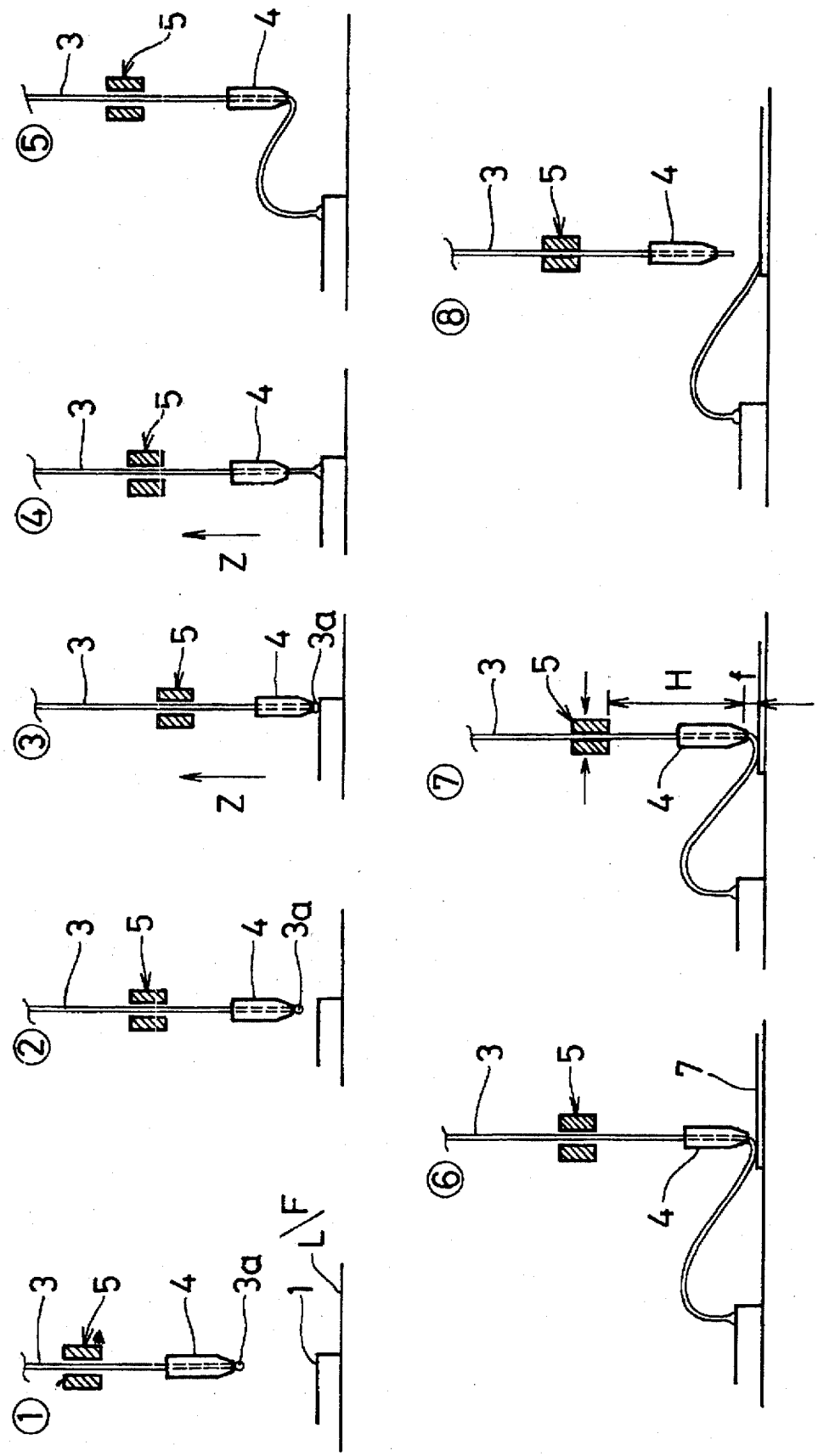
FIG. 1 is a drawing indicating the bonding process in a wire bonder of the prior art.

The following provides an explanation of a wire bonder (containing a wire guiding apparatus) as an embodiment of the present invention while referring to the attached drawings. In the following explanation, the same reference numerals are used for those constituents that are identical to each of the constituents of the apparatus of the prior art shown in FIG. 1.

Figure 2:
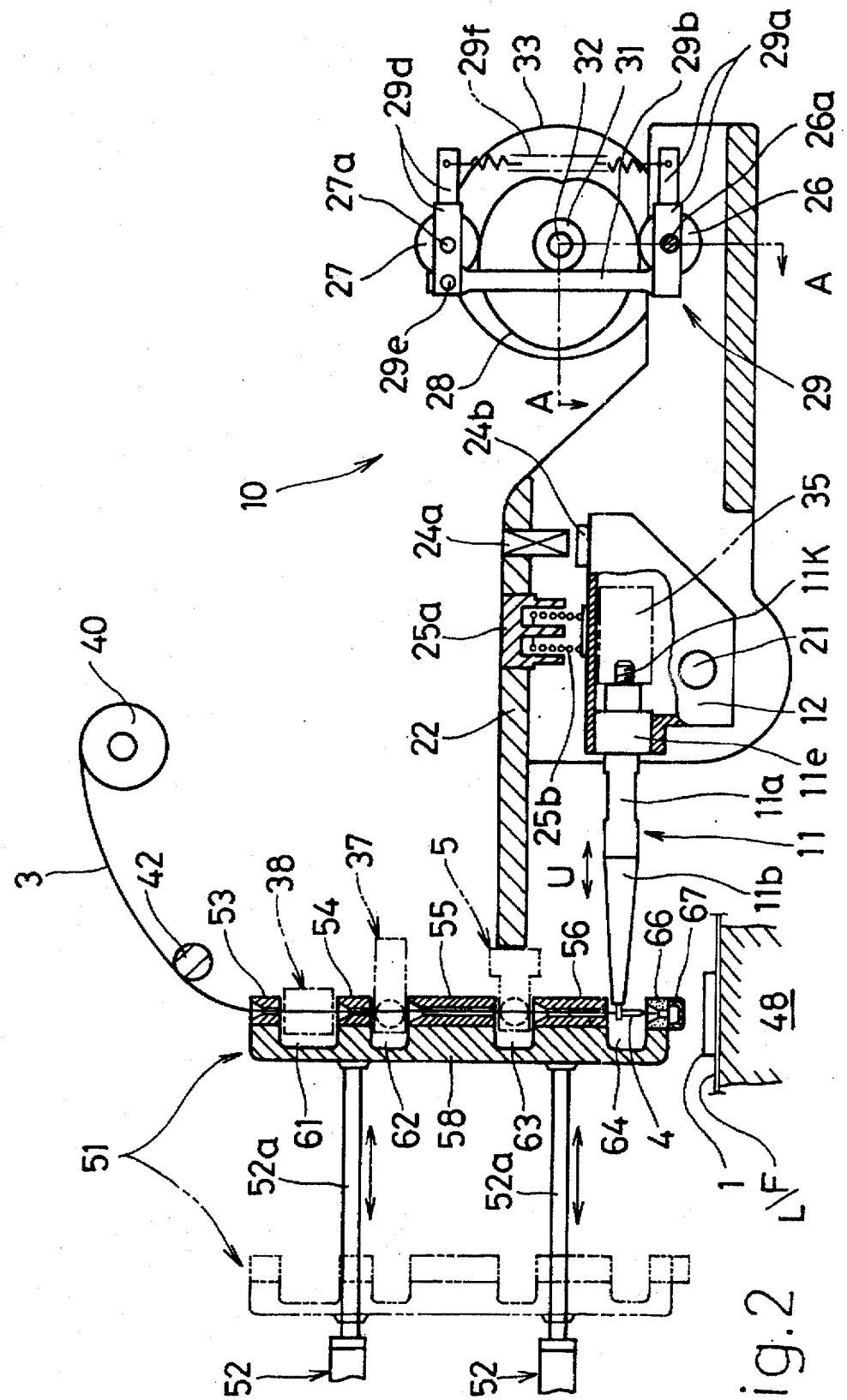
FIG. 2 is a front view, including a partial cross-section, of the essential portion of a wire bonder as an embodiment of the present invention.
Figure 3:
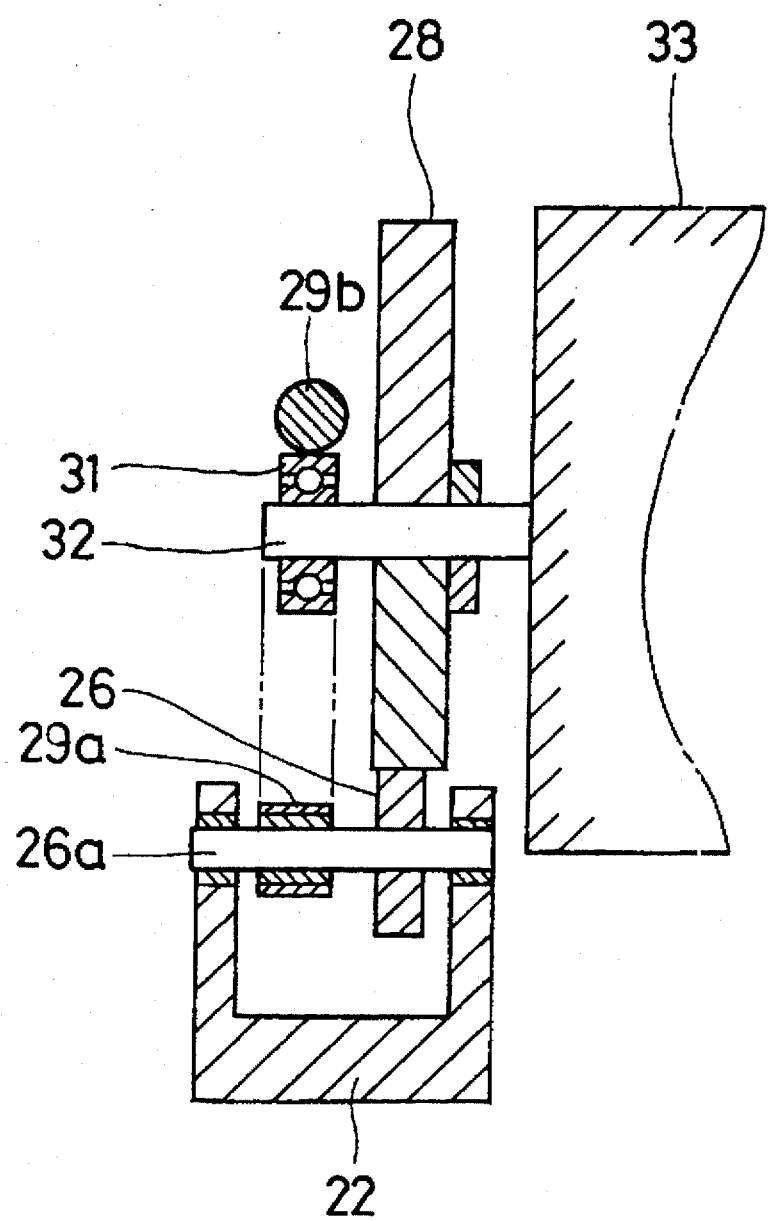
FIG. 3 is a view taken along arrows I—I relating to FIG. 2.

FIG. 2 shows the essential portion of a wire guiding apparatus as claimed in the present invention, while FIG. 3 shows a view taken along arrows I—I relating to FIG. 2.

First, an explanation is provided of bonding device 10 (see FIG. 2) that performs bonding work.

In FIG. 2, holding frame 12, which supports horn 11 and composes a bonding arm together with said horn 11, is fit onto rotating support shaft 21.

In addition, oscillating arm 22 is fit onto support shaft 21 while allowed to oscillate freely. Solenoid 24a and electromagnetic adsorption piece 24b are respectively mounted on oscillating arm 22 and holding frame 12 in mutual opposition, and when holding frame 12 is oscillated, power is supplied to solenoid 24a from a power supply not shown resulting in the production of adsorption force between solenoid 24a and electromagnetic adsorption piece 24b causing holding frame 12 and oscillating arm 22 to become fixed to each other.

Magnet 25a and coil 25b are respectively attached to oscillating arm 22 and holding frame 12 at locations in front of the above-mentioned electromagnetic adsorption device. This magnet 25a and coil 25b compose a device that generates adsorption force for forcing the end of horn 11, namely the portion that holds capillary 4, downward in FIG. 2 during bonding.

As shown in FIG. 3, support shaft 26a is embedded in the back end of oscillating arm 22, and arm side cam follower 26 and oscillating base 29a are able to rotate freely around this support shaft 26a. Bearing guide 29b is attached to oscillating base 29a at its lower end, while preloading arm 29d is attached while allowed to rotate freely to the upper end of this bearing guide 29b by means of support pin 29e. Support shaft 27a is provided on the free end of preloading arm 29d, and cam follower 27 is attached while allowed to rotate freely to said support shaft 27a.

A tension spring in the form of preloading spring 29f is attached between the end of this preloading arm 29d and the end of oscillating base 29a, and arm side cam follower 26 and cam follower 27 are pressed against a cam surface in the form of the outer surface of cam 28 formed into the shape of a heart.

Furthermore, the two points where arm side cam follower 26 and cam follower 27 make contact with cam 28 are located on both sides of the center of rotation of cam 28.

A frame structure is formed by the above-mentioned oscillating base 29a, bearing guide 29b and preloading arm 29d, and this is generically referred to as oscillating frame 29. Bearing guide 29b, which is one of the constituent members of oscillating frame 29, makes contact with the outer ring of radial bearing 31 attached to cam shaft 32 on which cam 28 is fit.

Cam 28 is rotated by torque applied to cam shaft 32 by motor 33. The bonding arm, composed of horn 11 and holding frame 12, oscillates in integrated fashion with oscillating arm 22 by the forward and reverse rotation of this cam 28. As a result, capillary 4 approaches and moves away from the bonding target.

As shown in FIG. 2, fitting portion 11e, which fits into holding frame 12 that holds horn 11, is provided near the back end of the horn 11. This fitting portion 11e is roughly in the shape of a cylinder, and is provided at a nodal point (location of a node of ultrasonic vibration) of horn 11.

Male thread portion 11k is formed in the back end of horn 11, and vibrator 35 is coupled to male thread portion 11k. Voltage of a prescribed frequency is applied to vibrator 35 by an oscillator not shown which causes vibrator 35 to generate ultrasonic vibrations of that frequency. This vibrator 35 and oscillator are generically referred to as an ultrasonic vibration device. Horn 11 has straight horn portion 11a, on which vibrator 35 is installed at its back end, and conical horn portion 11b, which amplifies the amplitude of ultrasonic vibrations transmitted from vibrator 35 through straight horn portion 11a and transmits them to capillary 4 on its end. Capillary 4 is then vibrated as a result of this.

Furthermore, horn 11 is formed from a material such as stainless steel (SUS), titanium (Ti) or its alloy steel and so forth.

On the other hand, the bonding tool in the form of capillary 4 attached to the end of horn 11 is made of a material selected from ceramics, rubies and so forth, and is formed to have a hollow center. As shown in FIG. 2, wire 3 is inserted from above through the hollow center, namely an insertion hole, and a ball (3a: see FIG. 1), which is formed by producing a high-voltage spark on the end of said wire 3, is thermocompression bonded to the pad (not shown) or lead (7: see FIG. 1) of the bonding target in the form of IC chip 1.

As shown by arrow U in FIG. 2, since the ultrasonic wave energy transmitted to horn 11 from vibrator 35 is in the form of longitudinal vibrations with respect to horn 11, the axial center of capillary 4 is installed at a right angle to the axial center of horn 11 so that the longitudinal vibrations are converted into horizontal vibrations that are necessary for bonding the above-mentioned ball of wire 3 to a pad and so forth.

Figure 4:
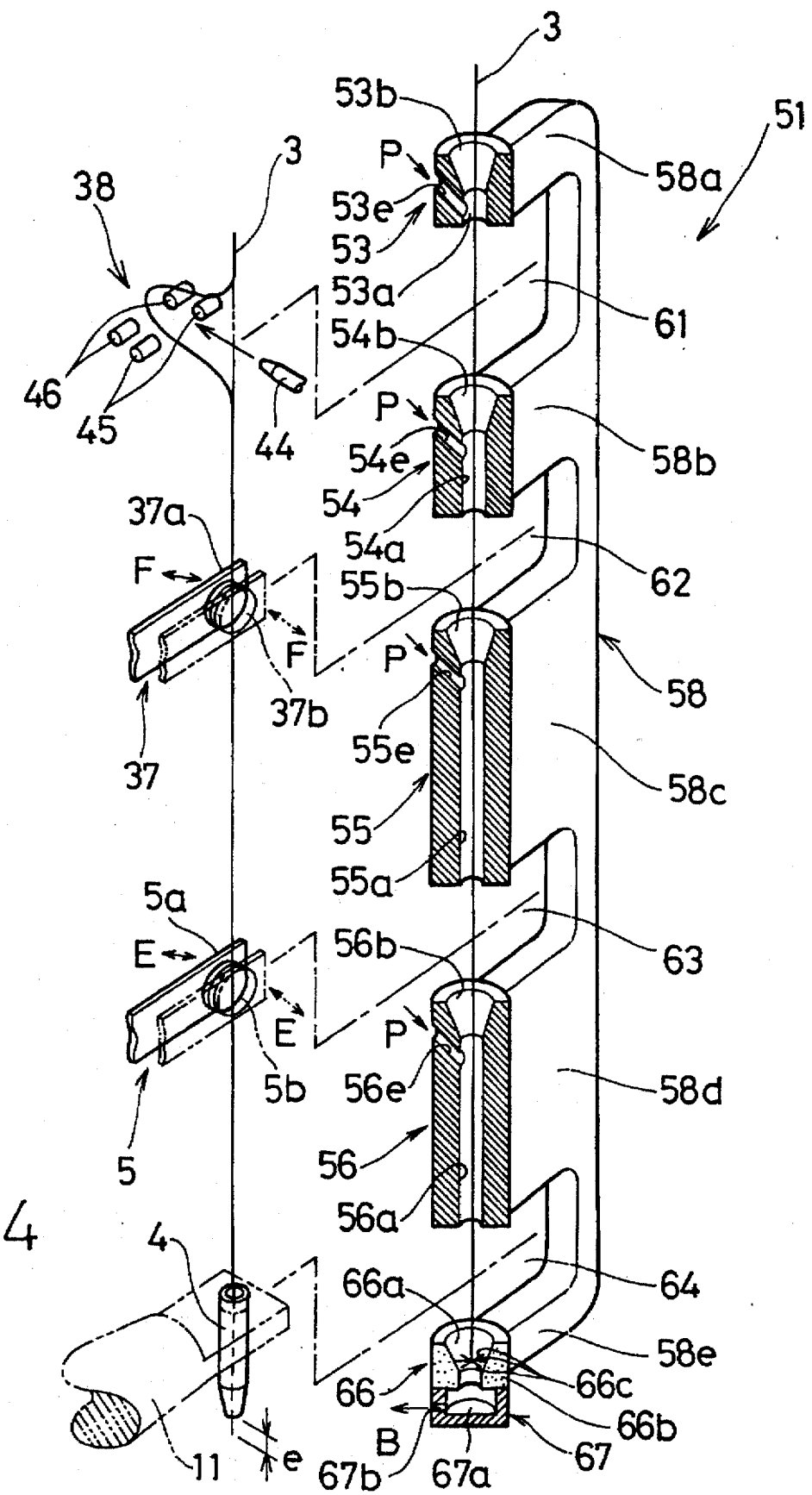
FIG. 4 is a perspective view, including a partial cross-section, indicating the guiding jig and related mechanical portions that are essential portions of the wire guiding apparatus equipped on the wire bonder shown in FIG. 2.

The following provides an explanation of the work performed with respect to a constitution of working devices that each perform prescribed work on a wire, starting with the above-mentioned capillary 4. As shown in FIGS. 2 and 4, wire clamp 5, half clamp 37 and air tension mechanism 38 are provided in addition to the above-mentioned capillary 4 as said working device. These are arranged upward in a row at intervals. However, half clamp 37 and air tension mechanism 38 are suitably provided as necessary.

Since the constitution and contents of work performed by capillary 4 have previously been explained, the explanation will start from wire clamp 5. As shown in FIG. 2, wire clamp 5 is installed on previously described oscillating arm 22.

As is clear from FIG. 4, this wire clamp 5 has a pair of clamping members 5a and 5b that perform opening and closing operation (indicated with arrow E) so as to clamp and release wire 3. In addition, although not shown in the drawing, wire clamp 5 is equipped with a driving device that opens and closes clamping members 5a and 5b. Since an explanation of the contents of work performed by this wire clamp 5 has already been given based on FIG. 1, that explanation is omitted here.

Next, half clamp 37 arranged above wire clamp 5 is composed in nearly the same manner as said wire clamp 5, having a pair of clamping members 37a and 37b that perform opening and closing operation (indicated with arrow F), and is equipped with a driving device (not shown) that opens and closes clamping members 37a and 37b. Said half clamp 37 holds wire 3 so that it is kept straight to the end of capillary 4 at all times by applying a prescribed tension to wire 3, and is mounted on an apparatus frame not shown.

Air tension mechanism 38, which is arranged above the above-mentioned half clamp 37, performs the work of promoting unraveling so that feeding of long wire 3 wound on a wire feeding device in the form of spool 40 is performed smoothly. Air tension mechanism 38 is mounted on the above-mentioned apparatus frame, and is composed in the manner described below.

Furthermore, reference numeral 42 in FIG. 2 is a guide that guides wire 3 fed from the above-mentioned spool 40 to air tension mechanism 38.

As shown in FIG. 4, air tension mechanism 38 is equipped with nozzle 44 and pushes wire 3 by blowing compressed air supplied from an air pump not shown from the side through said nozzle 44.

In addition, two photocouplers 45 and 46 are provided for confirming whether or not wire 3 is maintained in a smooth unraveling state by detecting wire 3 that has been deflected to the side by compressed air from said nozzle 44.

The following provides a brief explanation of the operation of the constitution for performing the wire bonding that has been explained thus far.

As shown in FIG. 2, lead frame L/F is provided on which a plurality of IC chips 1 are affixed in a row in the lengthwise direction (direction perpendicular to the surface of the paper in the drawing). At the start of bonding work, lead frame L/F is carried in by a transport device not shown onto bonding stage 48 that is heated by a heater block (not shown), and the first IC chip 1 is positioned at the bonding work position. In this state, bonding device 10 shown in FIG. 2 operates, and a first bonding point in the form of a pad (not shown) on IC chip 1 and a second bonding point in the form of an external lead (7: see FIG. 5) formed on lead frame L/F on which said IC chip is affixed, are connected by wire 3.

Since this wire connection between these two bonding points is performed in the same manner as the process indicated in FIG. 1, its explanation is omitted here.

During the above-mentioned wire connection, oscillation of the bonding arm composed of horn 11 and holding frame 12, namely the raising and lowering operation of capillary 4, is performed based on the operation of cam 28.

As was previously described, once connection of the first set of bonding points is completed, the above-mentioned series of operations is repeated for the plurality of pads provided on IC chip 1 and each of the leads arranged corresponding to them to complete bonding with respect to this first IC chip.

Next, lead frame L/F (see FIG. 2) is fed by the amount of the arrangement pitch of IC chip 1 and bonding work is performed on the next IC chip. Bonding work then continues in succession in similar fashion until bonding has been completed on all IC chips.

The constitution and operation for performing bonding work are as described above.

In the above-mentioned constitution, if wire 3 breaks for some reason during bonding work, or all the wire wound onto spool 40 is used up, the wire ends up coming out of the working device described above in the form of capillary 4, wire clamp 5, half clamp 37 and air tension mechanism 38. As a result, the wire must be reinserted through each of these working devices in order to continue bonding work.

In the wire bonder of the present invention, a wire guiding apparatus is added that performs this wire insertion work automatically.

Figure 5:
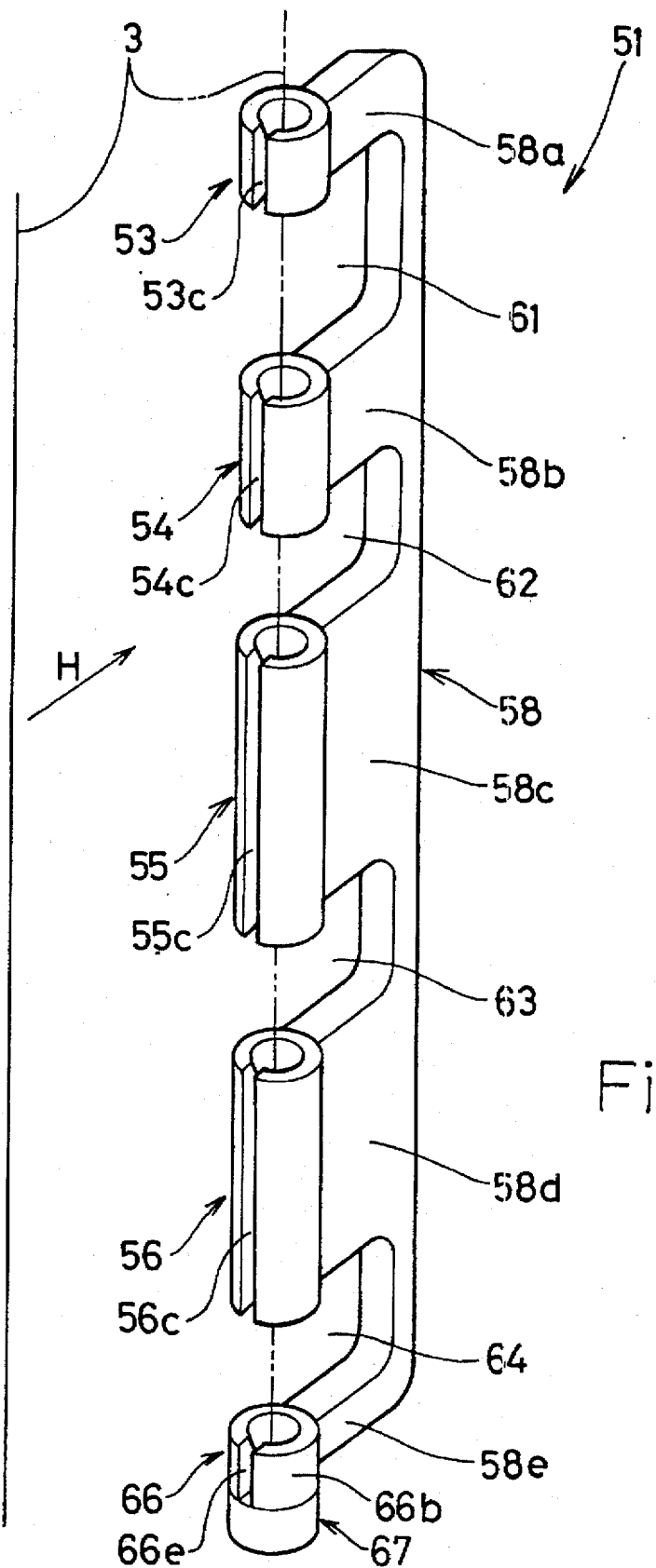
FIG. 5 is a perspective view showing the guiding jig and wire shown in FIG. 4.

The wire guiding apparatus has guiding jig 51 for guiding the wire shown in FIGS. 2 and 5, and a movement device in the form of air cylinders 52 that hold guiding jig 51 on the end of output rods 52a and move it between the position indicated with the solid lines and the position indicated with the broken lines in FIG. 2. The position indicated with the solid lines is the position at which guiding jig 51 is able to guide wire 3 to each of the above-mentioned working devices, namely air tension mechanism 38, half clamp 37, wire clamp 5 and capillary 4. The position indicated with the broken lines is the withdrawn position away from this guiding position.

The above-mentioned withdrawn position is not limited to the position shown in FIG. 2, but rather can be set to any desired position. The movement device for moving guiding jig 51 between the above-mentioned guiding position and withdrawn position is not limited to air cylinders 52 described above, but rather various types of devices can be applied including for example, a scalar robot. The movement device is suitably selected or designed according to the direction in which it is to move guiding jig 51, the path of movement, the movement stroke and so forth.

The following provides a description of the constitution of the above-mentioned guiding jig 51.

As shown in FIGS. 2 and 4, guiding jig 51 has four guiding members 53 through 56, which are formed into the shape of cylinders for guiding wire 3, and frame 58 for supporting each of guiding members 53 through 56. These guiding members 53 through 58 along with frame 58 are made of a material selected from a metal such as stainless steel (SUS) or plastic, and they may be mutually coupled after forming each of them separately, or may be formed as a single unit.

Each of the above-mentioned guiding members 53 through 56 are arranged along a straight line so as to be positioned directly above air tension mechanism 38, half clamp 37, wire clamp 5 and capillary 4, respectively. Wire 3 is guided through linear guide paths 53a through 56a (see FIG. 4) formed by each of the above-mentioned guiding members 53 through 56, and is sequentially inserted through air tension mechanism 38, half clamp 37, wire clamp 5 and capillary 4.

As shown in FIG. 4, tapered surfaces 53b through 56b for promoting feeding of wire 3 into each of guide paths 53a through 56a are formed in each of the above-mentioned guiding members 53 through 56. Accordingly, wire 3 is fed smoothly by tapered surfaces 53b through 56b resulting in increased work efficiency.

In addition, as shown in FIG. 5, slits 53c through 56c are formed in each guiding member 53 through 56 along their axial direction. These slits are for allowing wire 3, which had been inserted in guiding members 53 through 56 to come out when guiding jig 51, which includes each of said guiding members, moves from the previously described guiding position (position indicated with solid lines in FIG. 2) to the withdrawn position (position indicated with broken lines in FIG. 2) (indicated with arrow H in FIG. 5).

As shown in FIG. 4, connection paths 53e through 56e, which are continuous with respective guide path 53a through 56a, are provided through each guiding member 53 through 56 from the outside. These connection paths 53e through 56e are inclined in the direction in which wire 3 is to be guided, namely in the downward direction.

Each of the above-mentioned connection paths 53e through 56e are connected to one end of a tube not shown, while the other end of tube is connected to the compressed air spraying outlet of an air compressor and so forth (not shown) via a valve. This valve is an electromagnetic valve for supplying and shutting off compressed air.

An air spraying device sprays a gas, in this case compressed air, so as to force wire 3 in the guiding direction, is composed by each of the above-mentioned connection paths 53e through 56e, the above-mentioned tubes, and an air compressor and so forth.

On the other hand, in addition to frame 58 that supports each of the above-mentioned guiding members 53 through 56 having four supports 58a through 58d that are able to support each of said guiding members 53 through 56 on their ends in a state of cantilever support, as shown in FIGS. 4 and 5, another support 58e is also formed on frame 58 below the above-mentioned four supports 58a through 58d.

As is clear from FIGS. 2 and 4, four spaces 61 through 64 (also shown in FIG. 5), which are demarcated as a result of having two each of the five supports 58a through 58e on either side, are provided to have a size that enables insertion of the previously described air tension mechanism 38, half clamp 37, wire clamp 5 and capillary 4 with sufficient leeway.

As shown in FIG. 4, the fifth support 58e described above is located below the above-mentioned capillary 4, namely on the side of the wire guiding direction, and as shown in FIGS. 2 and 5, a detection device in the form of sensor 66 is attached to its end, while a small case 67 is mounted on the bottom of sensor 66.

The above-mentioned sensor 66 is composed of, for example, a touch sensor that detects the arrival of wire 3 by a state of electrical continuity being obtained when said wire 3, made of a metal having a high degree of electrical conductivity, makes contact with this sensor 66. More specifically, as shown in FIG. 4, sensor 66 has sensor body 66b which, together with being formed into roughly the shape of a cylinder from a non-conducting material such as plastic, tapered surface 66a is formed in its upper end for introducing wire 3, and a plurality of conducting wires 66c that are stretched across (that may also be in the form of mesh) the tapered portion so as to make contact with wire 3 at a right angle when it is inserted. The above-mentioned state of electrical continuity is obtained as a result of the end of wire 3 making contact with these conducting wires 66c. However, other types of sensors can also be applied, such as a photosensor, provided they are able to detect wire 3, and the location at which they are provided can naturally be suitably changed.

As a result of providing the above-mentioned sensor 66 at the location described above, it is able to detect insertion of wire 3 into capillary 4 as well as the prescribed feeding amount e (shown in FIG. 4).

As shown in FIG. 5, slit 66e is also formed in sensor body 66b of the above-mentioned sensor 66 in the same manner as slits 53c through 56c of each of the above-mentioned guiding members 53 through 56. This slit 66e is for allowing the end of wire 3, which had been inserted in sensor body 66b, to come out when guiding jig 51 moves from the guiding position (position indicated with solid lines in FIG. 2) to the withdrawn position (position indicated with broken lines in FIG. 2) (indicated with arrow H in FIG. 5).

As is clear from FIG. 4, case 67 mounted on the bottom of the above-mentioned sensor 66 is continuous with the space inside sensor 66. As shown in the drawing, connection path 67b, which is continuous with this inner space 67a is provided through case 67 from the outside. Connection path 67b is connected to one end of a tube not shown, and the other end of the tube is connected via a valve to the air suction port of a negative pressure generation device in the form of an air pump and so forth (not shown). This valve is an electromagnetic valve for suctioning air and shutting off that suctioning of air.

A suction device that suctions wire 3 together with air is composed by the above-mentioned connection hole 67b, the above-mentioned tube and air pump and so forth.

Next, the following provides a brief explanation of the operation of the wire guiding apparatus having the constitution described above.

Furthermore, control of the operation indicated below is performed by a controller composed of a microcomputer and so forth equipped on the wire bonder. This controller controls operation of the previously described bonding device 10.

If wire 3 should break for some reason during bonding work or if all the wire 3 wound onto spool 40 (see FIG. 2) is used up, this state is detected by a detection device (not shown) equipped on the wire bonder, which causes operation of bonding device 10 to stop based on its detection signal resulting in the state shown in FIG. 2.

In this state, air cylinders 52 shown in FIG. 2 are operated to protrude, and guiding jig 51 is positioned by moving from the withdrawn position indicated with broken lines in FIG. 2 to the guiding position indicated with solid lines in FIG. 2.

When guiding jig 51 is positioned, each electromagnetic valve connected with an air compressor and air pump not shown is opened. Accordingly, compressed air is sprayed into each guide path 53a through 56a through each connection path 53e through 56e of each guiding member 53 through 56 (indicated with arrow P in FIG. 4). In addition, air is suctioned through lower case 67 (indicated with arrow B in FIG. 4).

Nearly simultaneous to the opening operation of the above-mentioned electromagnetic valves, wire 3 is fed out above guiding jig 51. If the wire has broken during bonding work, then the wire following after the break is fed by rotation of spool 40 from this state, and if all the wire on spool 40 has been used up, then the spool is replaced with a new one and then that spool is rotated.

As a result of the above-mentioned spraying of compressed air, negative pressure is produced at the upper end of each guide path 53a through 56a of each guiding member 53 through 56. When wire 3 is fed in from above while in this state, the end of said wire is pulled into guide path 53a by the negative pressure produced at the entrance to said guide path 53a of the first guiding member 53. Then, wire 3 that has been pulled in is forcibly fed downward by the spraying of air from connection path 53a where it reaches the vicinity of the second guiding member 54.

Whereupon, compressed air acts in a similar manner in this second guiding member 54 as well so that the wire reaches the third guiding member 55. After this, wire 3 is similarly fed until it protrudes from the lower end of the fourth guiding member 56.

Wire 3 is therefore sequentially inserted through air tension mechanism 38, half clamp 37 and wire clamp 5 in the above-mentioned process.

As a result of having the above-mentioned constitution, fed wire 3 is rapidly guided into the guide paths and is smoothly inserted through the guide paths without becoming caught.

Wire 3, that has reached the lower end of the lowest guiding member 56 as a result of the action of the above-mentioned compressed air, is further suctioned with air that is suctioned in through case 67 arranged below it. Since this suction force acts through the insertion hole of capillary 4, wire 3 is suctioned into the insertion hole and protrudes from the end (lower end) of capillary 4. Namely, insertion into capillary 4, which is at the final stage of the entire wire insertion process, that includes insertion into wire clamp 5 and so forth above it, is performed reliably by this suction action. In addition, as a result of vibrator 35 vibrating capillary 4 at this time, the contact resistance when wire 3 is inserted into capillary 4 is reduced, thereby enabling wire 3 to be inserted smoothly.

Furthermore, although insertion of wire 3 is performed forcibly by spraying compressed air and performing suction of air from below in the present embodiment, this can also be done by using only guiding jig 51 without performing the above operations. However, since slippage and so forth of wire 3 that is fed is eliminated by spraying compressed air and suctioning air, wire 3 is inserted reliably without catching or bending.

As described above, the end of wire 3 passes through capillary 4 and makes contact with conducting wires 66c of sensor 66. As a result, each electromagnetic valve described above closes and the supplying of compressed air and suctioning of air are stopped. At the same time, feeding of wire 3 from spool 40 (see FIG. 2) is also stopped. The arrival of wire 3 at capillary 4, and the protruding of wire 3 from the end of said capillary 4 by a predetermined amount e (see FIG. 4) are confirmed by the detection signal emitted from this sensor 66. The protruding amount e is the amount required to form a ball on the end of wire 3 by a torch (not shown). As a result of said protruding amount being adjusted automatically in this manner, adjustment work by a worker is not required, thus enabling bonding work to be started immediately.

Once insertion of wire 3 has been completed in the manner described above, air cylinders 52 shown in FIG. 2 are pulled in, and guiding jig 51 moves from the guiding position (position indicated with solid lines in FIG. 2) to the withdrawn position (position indicated with broken lines in FIG. 2). At this time, it is preferable that wire clamp 5 and half clamp 37 shown in FIGS. 2 and 4 be closed and clamping wire 3. During this movement of guiding jig 51, wire 3 comes out through slits 53c through 56c and 66e respectively formed in each guiding member 53 through 56 and sensor 66.

Furthermore, these slits 53c through 56c and 66e do not have a significant effect on the spraying of compressed air and suction of air described above.

Thus, insertion of wire 3 into air tension mechanism 38, half clamp 37, wire clamp 5 and capillary 4 is completed.

Next, bonding device 10 is operated in the manner previously described and bonding work is started again.

In the wire bonder, attachment and removal work of guiding jig 51, which contains each of the above-mentioned guiding members 53 through 56, with respect to the guiding positions corresponding to capillary 4, wire clamp 5 and so forth are performed automatically by a movement device in the form of air cylinders 52. Accordingly, in consideration of the case of a worker performing this attachment and removal of said guiding jig 51 manually, the effect is obtained in which positioning of guiding jig 51 can be performed with high accuracy in comparison with being performed manually.

In addition, four of the above-mentioned guiding members that guide wire 3 are provided (53 through 56), and the wire bonder is equipped with frame 58 that supports each guiding members 53 through 56. Namely, each of guiding members 53 through 56 that guide wire 3 are mutually coupled in integrated fashion by frame 58, and each of the guiding members is moved simultaneous to frame 58 by the above-mentioned movement devices in the form of air cylinders 52. As a result of employing this constitution, the overall size of the apparatus can be reduced and the constitution simplified. This being the case, although it is possible to consider a constitution wherein, in the case of having a plurality of guiding members, each guiding member is separately moved by its own movement device, namely an air cylinder and so forth, this results in a large number of movement devices, which together with leading to increased size of the apparatus, would also make the structure more complex. In the wire guiding apparatus, a single movement device is sufficient for a plurality of guiding members.

Furthermore, although four guiding members 53 through 56 are provided in the present embodiment, this is because it is equipped with four working devices that perform the prescribed work on wire 3, namely air tension mechanism 38, half clamp 37, wire clamp 5 and capillary 4. Accordingly, the number of guiding members may be increased or decreased according to the number of said working devices provided.

Furthermore, the above-mentioned half clamp 37 may be substituted with an air tension mechanism (not shown) that performs the action of pulling up wire 3. In addition, air tension mechanism 38 provided in the present embodiment is for feeding wire 3.

In addition, although the above-mentioned guiding jig 51 is made to be movable and guiding jig 51 is moved to the guiding position during wire insertion and withdrawn following completion of insertion in the present embodiment, it may also be made to be in a fixed state. In this case, bonding device 10 (see FIG. 2) is moved by the operation of an XY table not shown, and capillary 4, wire clamp 5, half clamp 37 and air tension mechanism 38 are positioned with respect to guiding jig 51 that is mounted and waiting at a prescribed position, followed by insertion of wire 3.

In addition, although the above-mentioned guiding jig 51 only moves in the horizontal direction in the present embodiment, it is preferable that the position of said guiding jig 51 be able to be adjusted in the vertical direction as well, namely the guiding direction of wire 3 (and the direction opposite to it). If this is done, since the position of sensor 66 moves, the protruding amount e of wire 3 from the end of capillary 4 (see FIG. 4) can be set accurately.

As has been explained above, according to the present invention, a wire is smoothly passed through a wire clamp and inserted into the insertion hole of a bonding tool (capillary). Thus, wire insertion work can be performed easily and rapidly, thus improving work efficiency.

In addition, the present invention offers individual inherent advantages as a result of employing a wire guiding apparatus having the various constitutions described below.

First, the wire guiding apparatus has a gas spraying device that sprays a gas so as to force a wire in the direction of guiding. According to this constitution, negative pressure is produced by the spraying of a gas, the wire is pulled into a guide path by that negative pressure, and the wire that is pulled in is forcibly fed by the spraying force of that gas. As a result, the wire that is fed is introduced into the guide path rapidly and is smoothly inserted without getting caught within that guide path.

Next, a suction device is provided that is arranged in the wire guiding direction on the bonding tool and suctions the wire with air. In this constitution, suction force acts on the wire through the insertion hole in the bonding tool, the wire is suctioned into the insertion hole, and is made to protrude from the end of the bonding tool. Namely, insertion into the bonding tool, which is the final stage of the entire wire insertion process, including the insertion into a wire clamp and so forth, is performed reliably by the action of suction.

The wire guiding apparatus has a detection device arranged in the wire guiding direction on the bonding tool that detects insertion of the wire into the bonding tool and a prescribed fed amount. According to this constitution, the arrival of the wire in the bonding tool, and the protruding of a predetermined amount of wire from the end of the bonding tool are confirmed. This protruding amount is required for forming a ball by a torch, and as a result of said protruding amount being adjusted automatically in this manner, adjustment work performed by a worker is not required, thus enabling bonding work to be started immediately.

In addition, the wire guiding apparatus has a guiding member that guides a wire, and a movement device that holds the guiding member and moves it between a position at which it is able to guide the wire and another position. Namely, the work of attaching and removing the guiding member that guides the wire from a guiding position corresponding to a bonding tool and wire clamp is performed automatically by the movement device. Accordingly, in consideration of the case of a worker performing this attachment and removal of the guiding member manually, the effect is obtained in which positioning of the guiding member can be performed with high accuracy in comparison with being performed manually.

Moreover, the wire guiding apparatus is provided with a plurality of the above-mentioned guiding members, and is equipped with a frame that supports each of the guiding members. Namely, each of the guiding members that respectively perform wire guiding are alternately coupled in integrated fashion by the frame, and each of the guiding members is moved simultaneously by the above-mentioned movement device. According to this constitution, the overall size of the apparatus can be reduced and the constitution simplified. This being the case, although it is possible to consider a constitution wherein, in the case of having a plurality of guiding members, each guiding member is separately moved by its own movement device, namely an air cylinder and so forth, this results in a large number of movement devices, which together with leading to increased size of the apparatus, would also make the structure more complex. A single movement device is sufficient for a plurarity of guiding members.

In addition, in the wire guiding apparatus, a tapered surface is formed on the above-mentioned guiding member that promotes introduction of the wire into its guide path. Accordingly, the wire is introduced smoothly by the tapered surface, increasing work efficiency.

Moreover, the wire bonder as claimed in the present invention is equipped with an ultrasonic vibration device that vibrates the above-mentioned bonding tool. In the case of inserting the above-mentioned wire into the bonding tool, the ultrasonic vibration device is operated. As a result, contract resistance during insertion of the wire into the bonding tool is reduced, thereby enabling the wire to be inserted smoothly.

What is claimed is:

1. A wire guiding apparatus that performs wire insertion by guiding a wire supplied from a wire feeding device through the insertion holes of at least a wire clamp and bonding tool, said apparatus comprising a detection device arranged in the wire guiding direction on said bonding tool that detects insertion of said wire into said bonding tool and a prescribed fed amount of said wire.

2. The wire guiding apparatus as set forth in claim 1 having a gas spraying device that sprays gas so as to force said wire in the direction of guiding.

3. The wire guiding apparatus as set forth in claim 1 further comprising a suction device arranged in the wire guiding direction on said bonding tool that suctions said wire with air.

4. The wire guiding apparatus as set forth in claim 1 further comprising a guiding member that guides said wire, and a movement device that holds said guiding member and moves it between a position at which said wire is able to be guided and another position separated from said position.

5. The wire guiding apparatus as set forth in claim 4 wherein there are a plurality of said guiding members, and a frame that supports each of said guiding members.

6. The wire guiding apparatus as set forth in claim 4 wherein a tapered surface is formed on said guiding member that promotes introduction of a wire into its guide path.

7. A wire guiding method for performing wire insertion by guiding a wire supplied from a wire feeding device through the insertion holes of at least a wire clamp and bonding tool said method comprising detecting insertion of said wire into said bonding tool when a predetermined amount of said wire is fed out of said bonding tool.

8. A wire bonder that performs bonding by a wire inserted into a bonding tool, equipped with a wire guiding apparatus that performs wire insertion by guiding a wire supplied from a wire feeding device through the insertion holes of at least a wire clamp and bonding tool said wire bonder comprising a detection device arranged in the wire guiding direction on said bonding tool that detects insertion of said wire into said bonding tool and a prescribed fed amount of said wire.

9. The wire bonder as set forth in claim 8 further comprising an ultrasonic vibration device that vibrates said bonding tool, and operates said ultrasonic vibration device when said wire is inserted into said bonding tool.

10. A wire guiding apparatus for guiding a wire supplied from a wire feeding device through insertion holes of at least a wire clamp and a bonding tool, said apparatus comprising:

a plurality of guiding members that guide said wire;

a frame supporting said plurality of guiding members; and a movement device that supports said frame and moves said plurality of guide members between a first position at which said wire is guided through the insertion holes and a second position that is remote from said first position.

11. A wire guiding apparatus for guiding a wire supplied from a wire feeding device through insertion holes of at least a wire clamp and a bonding tool, said apparatus comprising:

a guiding member that guides said wire; and a movement device that supports said guide member and moves said guide member between a first position at which said wire is guided through the insertion holes and a second position that is remote from said first position.

12. A wire guiding apparatus as recited in claim 11, wherein said guiding member comprises a jig having at least one feed path and at least one exit slot formed therein, said wire being in said feed path when said guiding member is at said first position and said wire exiting said feed path through said exit slot when said guiding member is moved to said second position.

13. A method for guiding a wire supplied from a wire feeding device through insertion holes of at least a wire clamp and a bonding tool, said method comprising:

providing a plurality of guiding members that guide said wire;

providing a frame that supports said plurality of guiding members; and moving said frame between a first position at which said wire is guided through the insertion holes and a second position that is remote from said first position.

14. A method for guiding a wire supplied from a wire feeding device through insertion holes of at least a wire clamp and a bonding tool, said method comprising:

providing a guiding member that guides said wire; and providing a movement device that supports said guide member;

activating said movement device to move said guide member between a first position at which said wire is guided through the insertion holes and a second position that is remote from said first position.

15. A wire guiding method as recited in claim 14, wherein said guiding member comprises a jig having at least one feed path and at least one exit slot formed therein, said wire being in said feed path when said guiding member is at said first position and said wire exiting said feed path through said exit slot when said guiding member is moved to said second position.

* * * * *